United States Patent
Lin

(10) Patent No.: US 9,989,321 B2
(45) Date of Patent: Jun. 5, 2018

(54) HEAT DISSIPATION DEVICE

(71) Applicant: ASIA VITAL COMPONENTS CO., LTD., New Taipei (TW)

(72) Inventor: Yuan-Yi Lin, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 481 days.

(21) Appl. No.: 14/548,295

(22) Filed: Nov. 20, 2014

(65) Prior Publication Data

US 2016/0150672 A1 May 26, 2016

(51) Int. Cl.
| F28F 7/00 | (2006.01) |
| F28F 13/00 | (2006.01) |
| H01L 23/367 | (2006.01) |
| H01L 23/427 | (2006.01) |
| H01L 23/40 | (2006.01) |
| H01L 23/467 | (2006.01) |

(52) U.S. Cl.
CPC ............ F28F 13/00 (2013.01); H01L 23/367 (2013.01); H01L 23/427 (2013.01); *H01L 23/3672* (2013.01); *H01L 23/4006* (2013.01); *H01L 23/467* (2013.01); *H01L 2924/0002* (2013.01)

(58) Field of Classification Search
CPC .............. F28F 13/00; F28D 2021/0028; F28D 2021/0029; H01L 23/40; H01L 23/46; H01L 23/473

See application file for complete search history.

(56) References Cited

U.S. PATENT DOCUMENTS

| 6,809,929 | B2* | 10/2004 | Liu ..................... H01L 21/4882 165/80.2 |
| 7,599,185 | B2* | 10/2009 | Meyer, IV ........... H01L 23/427 165/104.21 |
| 2003/0168207 | A1* | 9/2003 | Wang .................. F28D 15/0233 165/104.26 |
| 2009/0231814 | A1* | 9/2009 | Liao ...................... H01L 23/34 361/704 |

(Continued)

FOREIGN PATENT DOCUMENTS

| CN | 201167446 Y | 12/2008 |
| CN | 202003980 U | 10/2011 |

(Continued)

*Primary Examiner* — Len Tran
*Assistant Examiner* — Jon T Schermerhorn
(74) *Attorney, Agent, or Firm* — C. G. Mersereau; Nikolai & Mersereau, P.A.

(57) ABSTRACT

A heat dissipation device includes a heat dissipation member, a heat transfer member, and a reinforcing member. The heat transfer member has one side attached to the heat dissipation member, and two opposite lateral edges thereof are respectively provided with at least one connection portion and at least one through hole. The reinforcing member is connected to the other side of the heat transfer member, and two opposite lateral edges thereof are respectively formed with at least one mating connection portion for correspondingly connecting to the connection portion. The reinforcing member is provided at a central portion with an opening. With these arrangements, the heat transfer member can bear a larger locking force when the heat dissipation member is locked thereto, and is also prevented from deformation.

4 Claims, 7 Drawing Sheets

(56) References Cited

U.S. PATENT DOCUMENTS

2014/0069611 A1* 3/2014 Liu .................. H01L 23/36
165/80.3

FOREIGN PATENT DOCUMENTS

| CN | 102956582 A | 3/2013 |
| CN | 203454875 U | 2/2014 |
| JP | 2014053442 A | 3/2014 |
| TW | 200821803 A | 5/2008 |

* cited by examiner

HEAT DISSIPATION DEVICE

FIELD OF THE INVENTION

The present invention relates to a heat dissipation device, and more specifically, to a heat dissipation device that has a heat transfer member not only capable of bearing a larger locking force when a heat dissipation member is locked thereto, but also prevented from deformation.

BACKGROUND OF THE INVENTION

As the advancement of technology, the electronic elements have higher and higher operation performance, so that the demand for high efficiency heat dissipation unit has also increased. In order to increase heat dissipation effect, the conventional heat dissipation units usually adopt a stacked heat radiation fin assembly, and continuous developments have also been made in heat dissipation fins. Therefore, it is the foremost issue in the contemporary electronic industry to develop high-efficiency heat dissipation devices. Alternatively, on the electronic elements, heat dissipation members are disposed to cool the electronic elements. The heat dissipation members are normally radiators or heat radiation fins, which cooperate with a cooling fan to dissipate heat, so that the heat is transferred from the heat dissipation member via the heat transfer member to a cooler side for dissipating into the ambient environment.

Conventionally, vapor chambers serve as heat transfer members due to the vapor/liquid phase circulation therein and are often applied in the heat dissipation field. With the advancement of the technology and the demand for thin and light products, the heat transfer member is now extremely thin, but fails to bear a large locking force when the heat dissipation member is locked thereto. As a result, the heat transfer member will bend and deform to adversely affect its heat transfer efficiency or even become useless.

In brief, the heat transfer member in the conventional heat dissipation device has the following defects: (1) unable to bear a larger locking force; (2) easy to deform; and (3) having a low heat transfer effect.

It is therefore tried by the inventor to develop an improved heat dissipation device to overcome the problems of the conventional heat dissipation device.

SUMMARY OF THE INVENTION

To solve the above problems, a primary object of the present invention is to provide a heat dissipation device that has a heat transfer member capable of bearing a larger locking force when a heat dissipation member is locked thereto.

Another object of the present invention is to provide a heat dissipation device that has a heat transfer member being prevented from deformation.

To achieve the above and other objects, the present invention provides a heat dissipation device including a heat dissipation member, a heat transfer member, and a reinforcing member. The heat transfer member has one side attached to the heat dissipation member, and two opposite lateral edges thereof are respectively provided with at least one connection portion. The reinforcing member is connected to the other side of the heat transfer member, and two opposite lateral edges thereof are respectively formed with at least one mating connection portion for correspondingly connecting to the connection portion. The reinforcing member is provided at a central portion with an opening. With these arrangements, the heat transfer member with the reinforcing member connected thereto can bear a larger locking force when the heat dissipation member is locked thereto and is prevented from deformation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
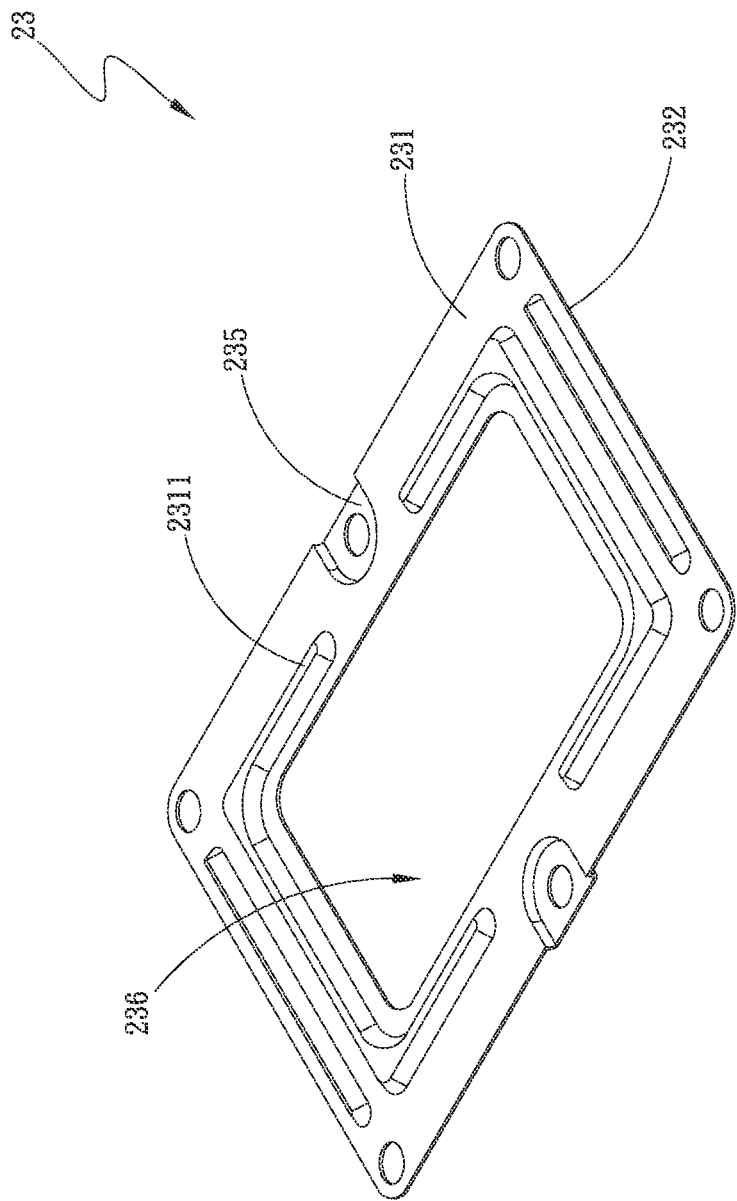
FIG. 1A is a top perspective view of a reinforcing member included in a heat dissipation device according to a first embodiment of the present invention.

The present invention will now be described with some preferred embodiments thereof and by referring to the accompanying drawings. For the purpose of easy to understand, elements that are the same in the preferred embodiments are denoted by the same reference numerals.

Figure 1B:
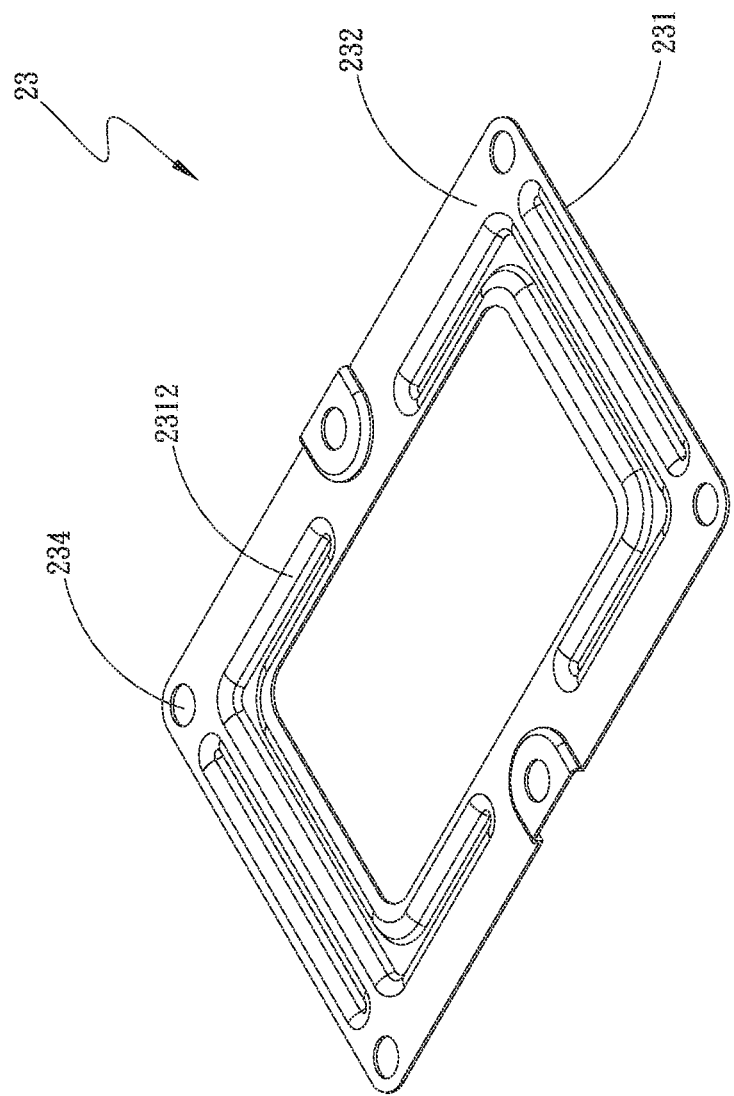
FIG. 1B is a bottom perspective view of the reinforcing member of FIG. 1A.
Figure 2A:
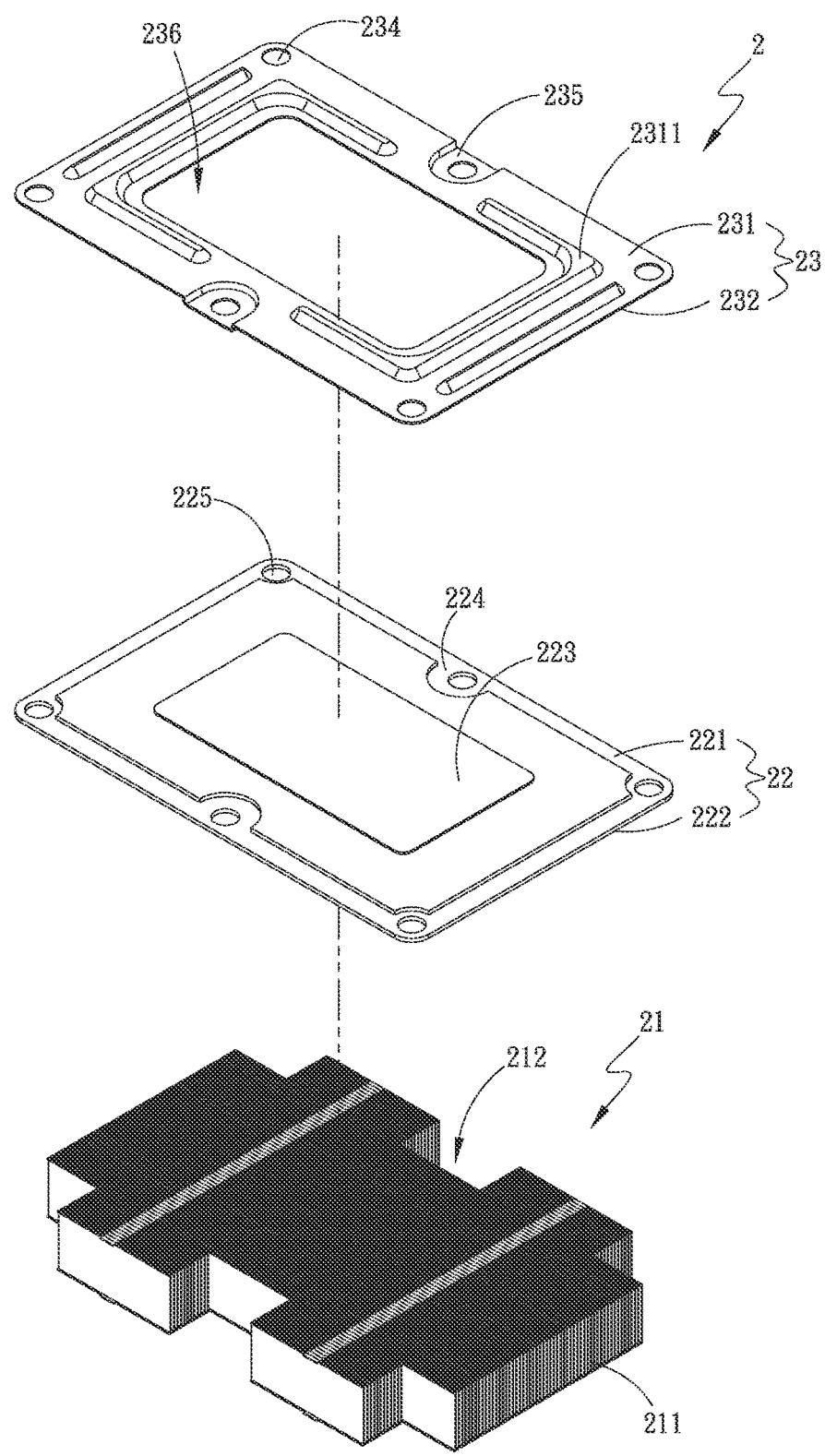
FIG. 2A is an exploded perspective view of the heat dissipation device according to the first embodiment of the present invention.
Figure 2B:
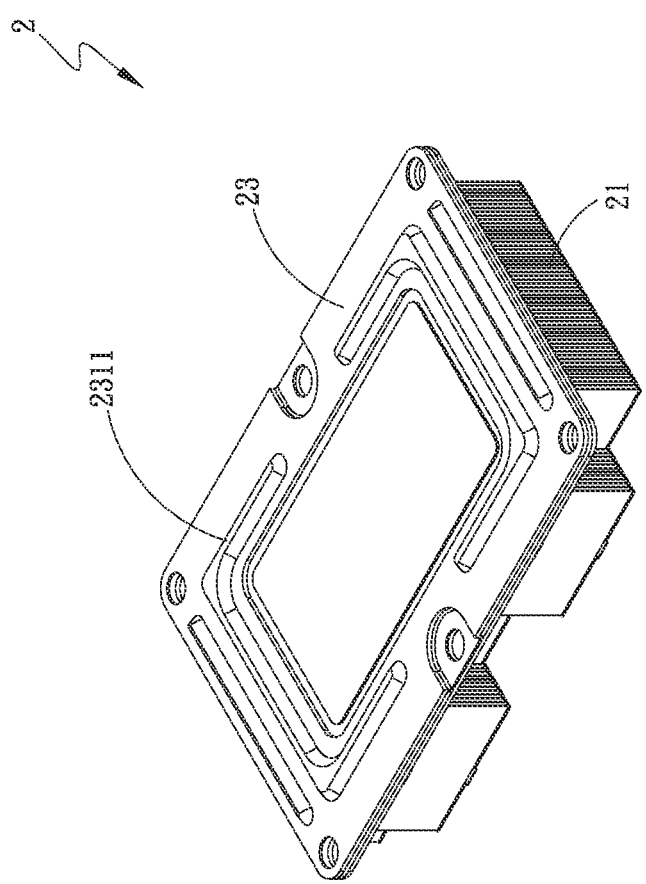
FIG. 2B is an assembled perspective view of FIG. 2A.

Please refer to FIGS. 1A and 1B, which are top and bottom perspective views, respectively, of a reinforcing member 23 included in a heat dissipation device 2 according to a first embodiment of the present invention, and to FIGS. 2A and 2B, which are exploded and assembled perspective views, respectively, of the heat dissipation device 2 according to the first embodiment of the present invention. As shown, the heat dissipation device 2 includes a heat dissipation member 21, a heat transfer member 22, and a reinforcing member 23. The heat dissipation member 21 includes a plurality of heat radiation fins 211 and defines at least one recessed portion 212.

The heat transfer member 22 has one side attached to the heat dissipation member 21, and two opposite lateral edges thereof are respectively provided with at least one connection portion 224 and at least one through hole 225.

The reinforcing member 23 is connected to the other side of the heat transfer member 22, and two opposite lateral edges thereof are respectively formed with at least one mating connection portion 235 for correspondingly connecting to the connection portion 224. Further, the reinforcing member 23 is provided at a central portion with an opening 236 and has four corners respectively formed with at least one hole 234.

The heat transfer member 22 can be a vapor chamber, which is formed at a central portion with a raised portion 223 for fitting in the opening 236 to be flush with or slightly raised from a top side 231 of the reinforcing member 23. The heat transfer member 22 includes a first side 221 and a second side 222 opposite to the first side 221. The first side 221 of the heat transfer member 22 is connected to the reinforcing member 23, whereas the second side 222 of the heat transfer member 22 is connected to the heat dissipation member 21. The through holes 225 on the four corners of the heat transfer member 22 are located corresponding to and communicate with the holes 234. The recessed portions 212 defined on the heat dissipation member 21 are located at positions corresponding to the holes 234 and the through holes 225.

The reinforcing member 23 includes a top side 231 and a bottom side 232. The top side 231 is provided with at least one raised rib portion 2311, such that the bottom side 232 is formed at a position corresponding to the raised rib portion 2311 with at least one groove 2312. The raised rib portions 2311 are distributed over the top side 231 of the reinforcing member 23 to enhance the structural strength thereof. The reinforcing member 23 is made of a metal material or a non-metal material.

The heat transfer member 22 is made of a metal material, such as copper, aluminum, or any other thermally conductive metal. In the illustrated embodiments of the present invention, the heat transfer member 22 is made of a copper plate. The reinforcing member 23 is made of a material more rigid than that of the heat transfer member 22 and is provided with the raised rib portions 2311 to have enhanced structural strength. Therefore, when the reinforcing member 23 and the heat transfer member 22 are connected to each other, they can together bear an increased locking force when the heat dissipation member 21 is locked thereto. In addition, the reinforcing member 23 also prevents the heat transfer member 22 from deformation, allowing the heat transfer member 22 to have largely increased heat transfer effect.

Figure 3:
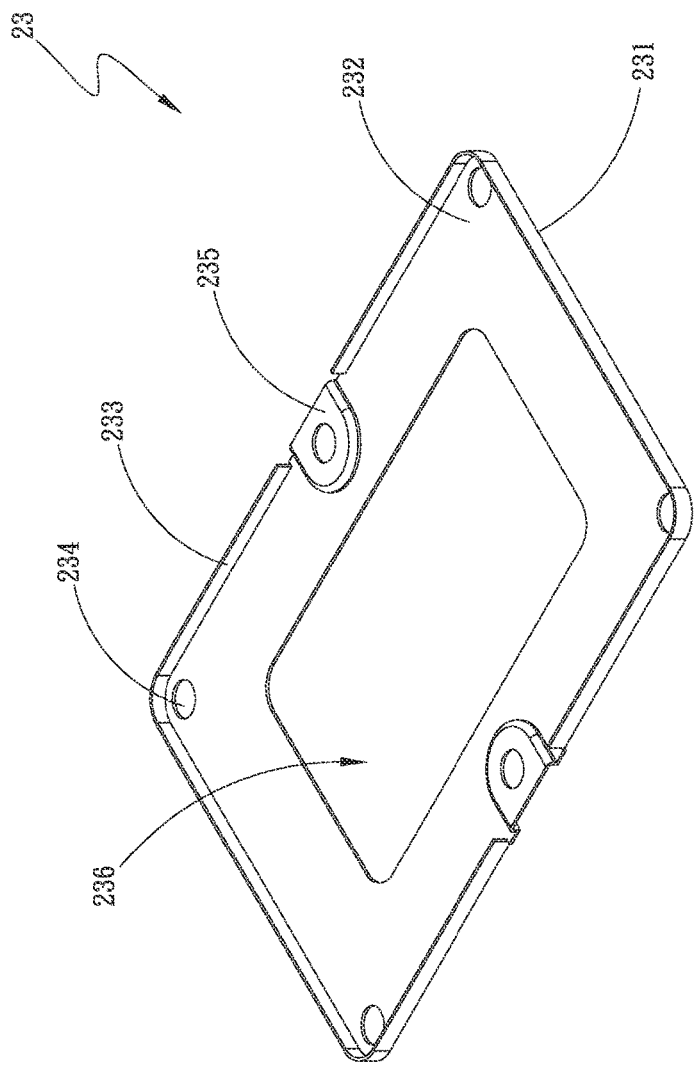
FIG. 3 is a bottom perspective view of a reinforcing member included in the heat dissipation device according to a second embodiment of the present invention.
Figure 4A:
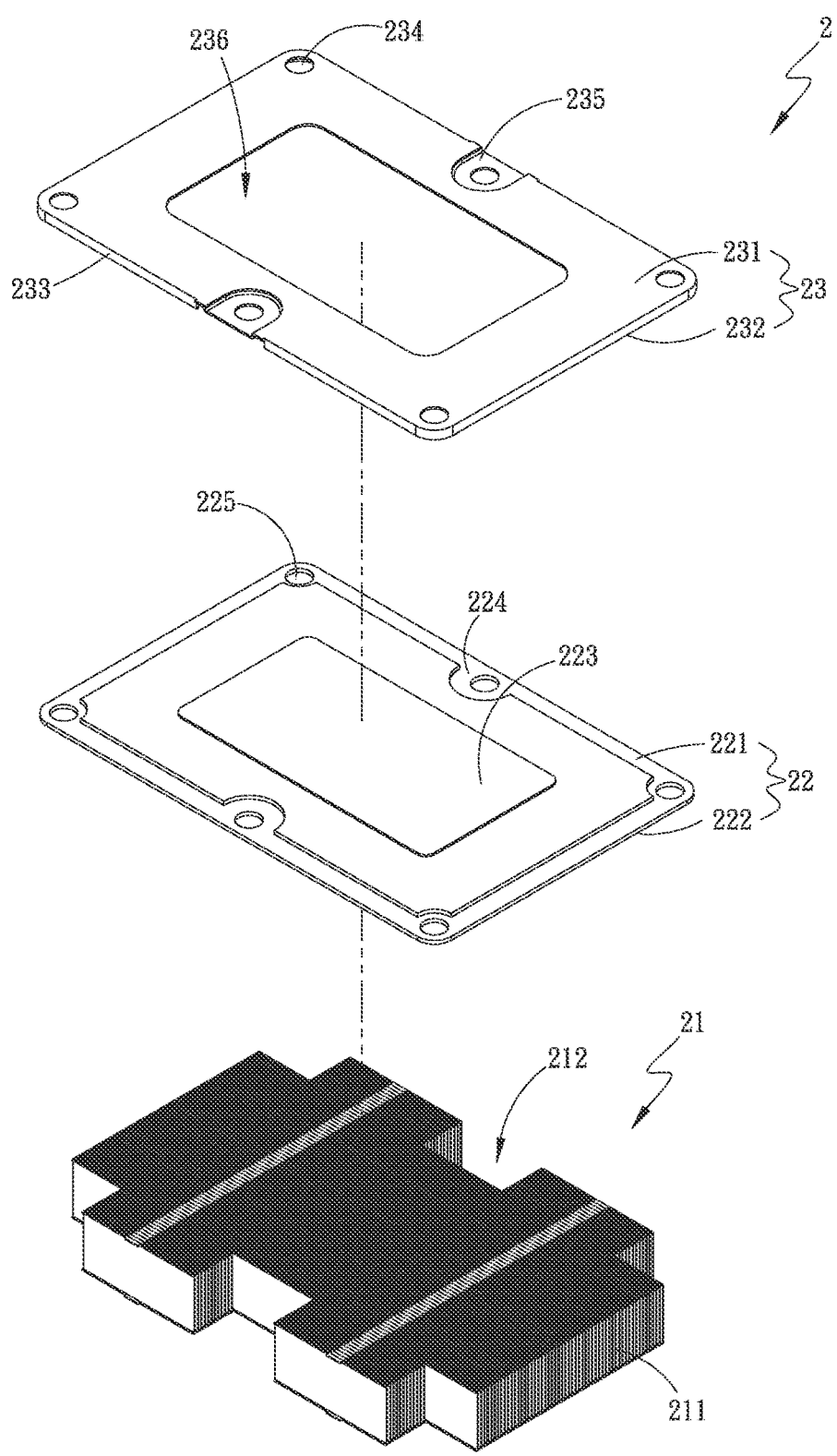
FIG. 4A is an exploded perspective view of the heat dissipation device according to the second embodiment of the present invention.
Figure 4B:
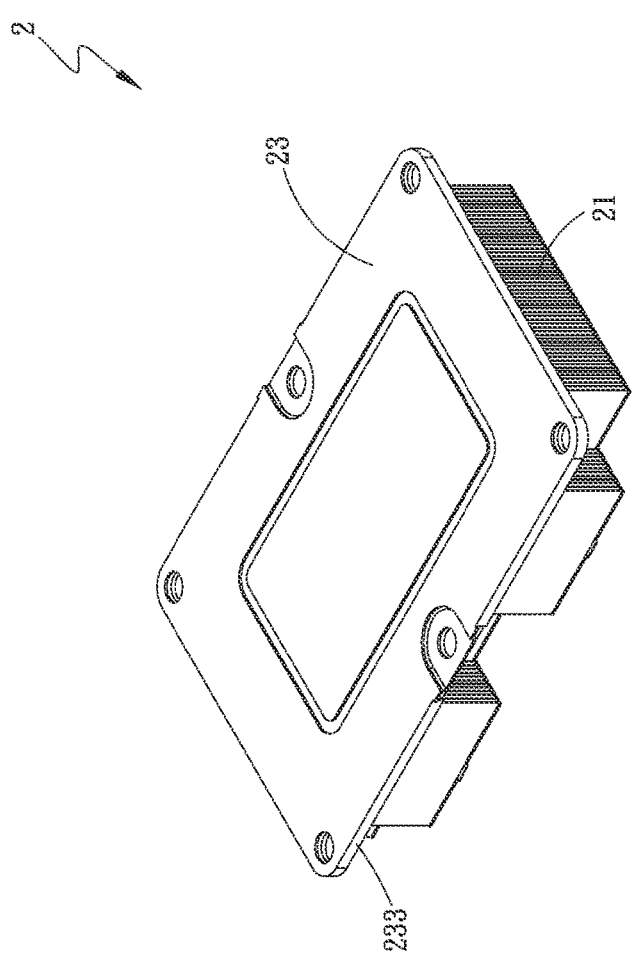
FIG. 4B is an assembled perspective view of FIG. 4A.

Please refer to FIGS. 4A and 4B, which are exploded and assembled perspective views, respectively, of the heat dissipation device 2 according to a second embodiment of the present invention, and to FIG. 3, which is a bottom perspective view of a reinforcing member 23 included in the second embodiment. As shown, the second embodiment of the heat dissipation device is generally structurally similar to the first embodiment except that, in this second embodiment, the reinforcing member 23 has a peripheral edge extended towards the bottom side 232 to form a wall portion 233 for covering or locating the heat transfer member 22 in place. That is, in the second embodiment, the reinforcing member 23 is covered onto the heat transfer member 22. Since the reinforcing member 23 is made of a material more rigid than that of the heat transfer member 22, the reinforcing member 23 and the heat transfer member 22 connected to each other can bear a larger locking force when the heat dissipation member 21 is locked thereto. In addition, the reinforcing member 23 also prevents the heat transfer member 22 from deformation, allowing the heat transfer member to have largely increased heat transfer effect.

In conclusion, compared to the prior art, the present invention has the following advantages: (1) Being capable of bearing a larger locking force applied thereto; (2) Preventing the heat transfer member from deformation; and (3) Having a largely increased heat transfer effect.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat dissipation device, comprising:
    a heat dissipation member having a plurality of heat radiation fins;
    a vapor chamber having a first side and a second side, the second side being attached to the heat dissipation member, a raised portion being formed at a central portion of the first side, and two opposite lateral edges of the vapor chamber being respectively provided with at least one connection portion; and
    a reinforcing member being connected to the first side of the vapor chamber, and two opposite lateral edges thereof being respectively formed with at least one mating connection portion for correspondingly connecting to the connection portion; and the reinforcing member being provided at a central portion with an opening;
    wherein the reinforcing member has an outer side and an inner side, the outer side being provided with at least one U-shaped raised rib portion, such that the inner side is formed at a position corresponding to the raised rib portion with at least one groove, and the raised rib portion being distributed over the top side of the reinforcing member;
    wherein the heat dissipation member and the vapor chamber are disposed on the same side of the reinforcing member so as the heat dissipation device can bear a locking force; and
    wherein the vapor chamber has four corners respectively each formed with at least one through hole; and each through hole is located at a position corresponding to and communicating with a hole on the reinforcing member.

2. The heat dissipation device as claimed in claim 1, wherein the reinforcing member has four corners respectively each formed with at least one hole.

3. The heat dissipation device as claimed in claim 1, wherein the heat dissipation member defines at least one recessed portion at a position corresponding to a hole and a through hole.

4. The heat dissipation device as claimed in claim 1, wherein the reinforcing member is made of a material selected from the group consisting of a metal material and a non-metal material.

* * * * *